United States Patent [19]

Swanson

[11] Patent Number: 5,070,309
[45] Date of Patent: Dec. 3, 1991

[54] RF POWER AMPLIFIER HAVING IMPROVED AMPLIFIER PROTECTION

[75] Inventor: Hilmer I. Swanson, Quincy, Ill.
[73] Assignee: Harris Corporation, Melbourne, Fla.
[21] Appl. No.: 646,832
[22] Filed: Jan. 28, 1991
[51] Int. Cl.[5] ............................................. M02H 7/20
[52] U.S. Cl. .................................... 330/298; 455/117; 330/207 P
[58] Field of Search ...................... 330/51, 207 P, 298, 330/2; 455/115, 116, 117

[56] References Cited

U.S. PATENT DOCUMENTS 4,257,123  3/1981  Birt et al. ......................... 455/117 X
4,859,967  8/1989  Swanson ............................. 330/298

Primary Examiner—Steven Mottola
Attorney, Agent, or Firm—Tarolli, Sundheim & Covell

[57] ABSTRACT

An RF power amplifier having amplifier protection is presented wherein an RF source supplies an RF input signal to an actuatable RF power amplifier having an on condition and an off condition for, when on, normally receiving and amplifying the input RF signal to provide an amplified output RF signal. RF current and RF voltage in the output circuit are detected. A first signal is provided from the RF current and exhibits a fixed amplitude but a frequency and phase corresponding with that of the RF current. A second signal is provided of the fixed amplitude and which corresponds in frequency and phase with the RF voltage. The first and second signals are compared so as to provide a phase signal having a magnitude dependent upon the phase difference between the first and second signals. This phase signal is then compared with a reference to provide a turn-off signal in dependence upon the comparison for purposes of actuating an RF power amplifier to its off condition.

7 Claims, 3 Drawing Sheets

RF POWER AMPLIFIER HAVING IMPROVED AMPLIFIER PROTECTION

BACKGROUND AND FIELD OF THE INVENTION

The present invention relates to the art of protection circuitry for a power amplifier and, more particularly, for protection circuitry for an RF power amplifier of the type employed in AM radio broadcasting.

It is known in the art to provide VSWR protection circuitry for use in protecting an RF power amplifier to insure that the power amplifier is not damaged at high levels of VSWR. Such protection circuits, for example, will sense the forward power level and the reflected power level and control the transmitted output power when the ratio of the reflected power to the forward power becomes too great. Such a circuit is disclosed in U.S. Pat. No. 4,353,037 to G. D. Miller.

Another example of an RF power amplifier having VSWR protection circuitry is presented in my U.S. Pat. No. 4,859,967 entitled "RF Power Amplifier Protection", which issued on Aug. 22, 1989, the disclosure of which is incorporated herein by reference.

As discussed in my aforesaid U.S. Pat. No. 4,859,967 such RF power amplifiers frequently include transistors which may be damaged if operated at high levels of VSWR. These transistors may take the form of MOSFET transistors connected together in a bridge circuit. Failure of these transistors due to high VSWR conditions may be prevented by turning off the power amplifier for a short period of time after detecting a high VSWR condition. Most VSWR protection circuits will turn an amplifier off at a certain level of VSWR even though the amplifier may not be under stress. That is, most amplifiers can tolerate a wide range of impedance variation so long as the variations present a resistive load to the power amplifier. Turning off an RF power amplifier at a certain level of VSWR may be unnecessary as the amplifier may not be under stress during a resistive load. This can lead to needless interruptions of RF transmitter service.

SUMMARY OF THE INVENTION

It is an object of the present invention to prevent RF power amplifier failure by turning off the amplifier in response to determining whether the phase relationship between current and voltage in the output circuit exceeds a reference level.

In accordance with the present invention, an RF power amplifier is provided having improved amplifier protection. An RF source provides an RF input signal to an actuatable RF power amplifier having an ON condition and an OFF condition and which serves, when ON, to receive and amplify the input RF signal to provide an amplified output RF signal. An RF current sensor is coupled to the output circuit and serves to sense whether any RF current flows in the output circuit. Also, an RF voltage sensor is coupled to the output circuit and serves to sense any RF voltage at the output circuit. First and second signals of the same amplitude are provided with the first signal corresponding in phase and frequency with the RF current and the second signal corresponding in phase and frequency with the RF voltage. A phase signal is developed having a magnitude dependent upon the phase difference between the first and second signals and a turn-off signal is provided for turning off the RF power amplifier in dependence upon a comparison between the phase signal and a reference.

BRIEF DESCRIPTION OF THE DRAWINGS

The foregoing and other objects and advantages of the present invention will become more readily apparent from the following description as taken in conjunction with the accompanying drawings, wherein.

DESCRIPTION OF A PREFERRED EMBODIMENT

One application of the present invention is in conjunction with protecting RF power amplifiers employed in an AM broadcast transmitter. An example of such a transmitter is presented in FIG. 1 and takes the form of a digital amplitude modulator such as that illustrated and described in my aforesaid U.S. Pat. No. 4,859,967, which is assigned to the same assignee as the present invention, the disclosure of which is herein incorporated by reference.

Figure 1:
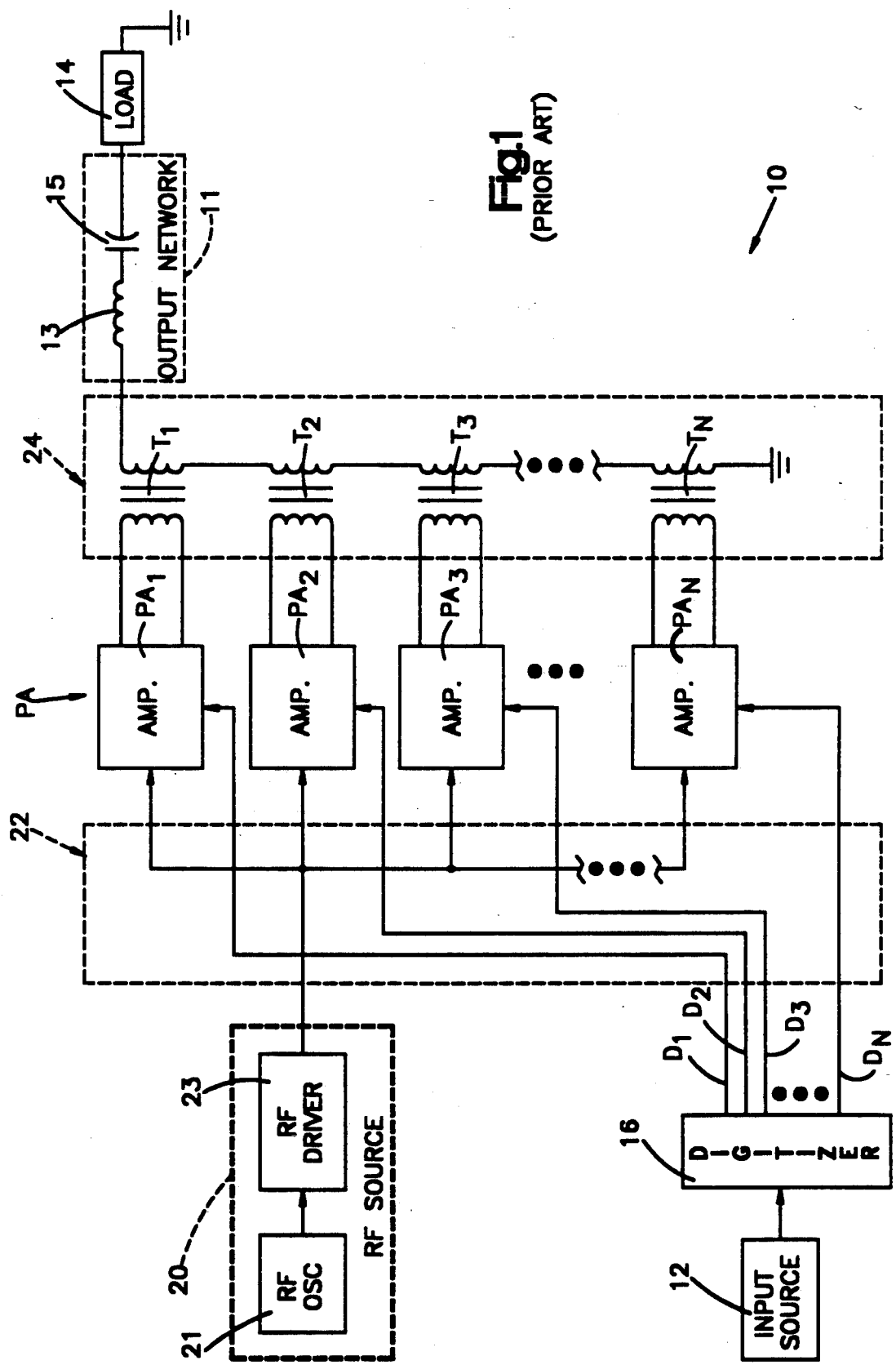
FIG. 1 is a schematic-block diagram illustration of one application to which the present invention may be applied.
Figure 2A:
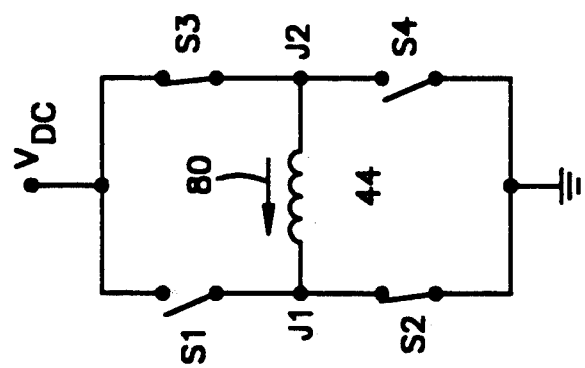
FIG. 2A is a simplified schematic circuit useful in understanding the operation of the circuit shown in FIG. 2.
Figure 2:
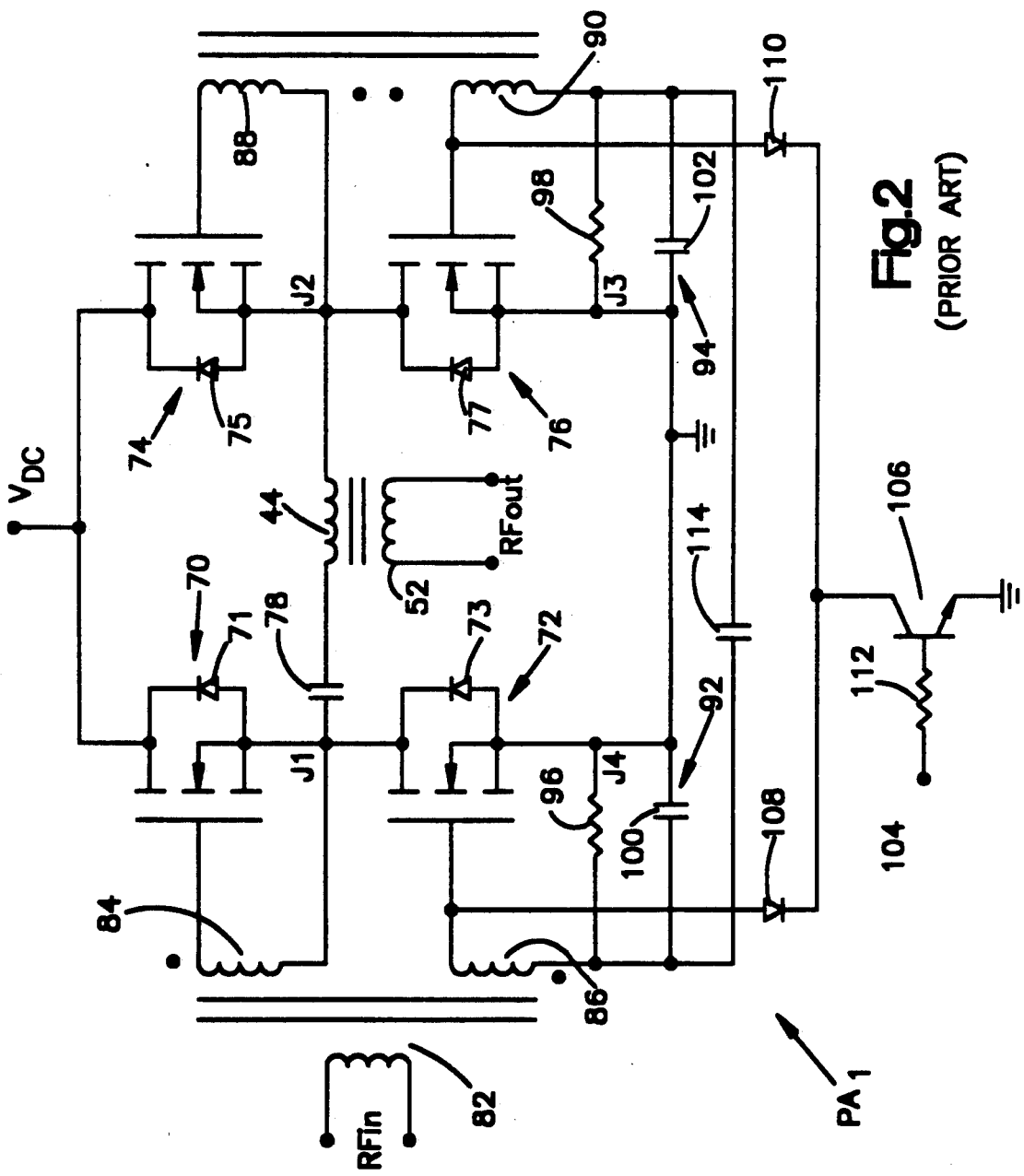
FIG. 2 is a schematic circuit illustration of one of the power amplifiers employed in FIG. 1.
Figure 3:
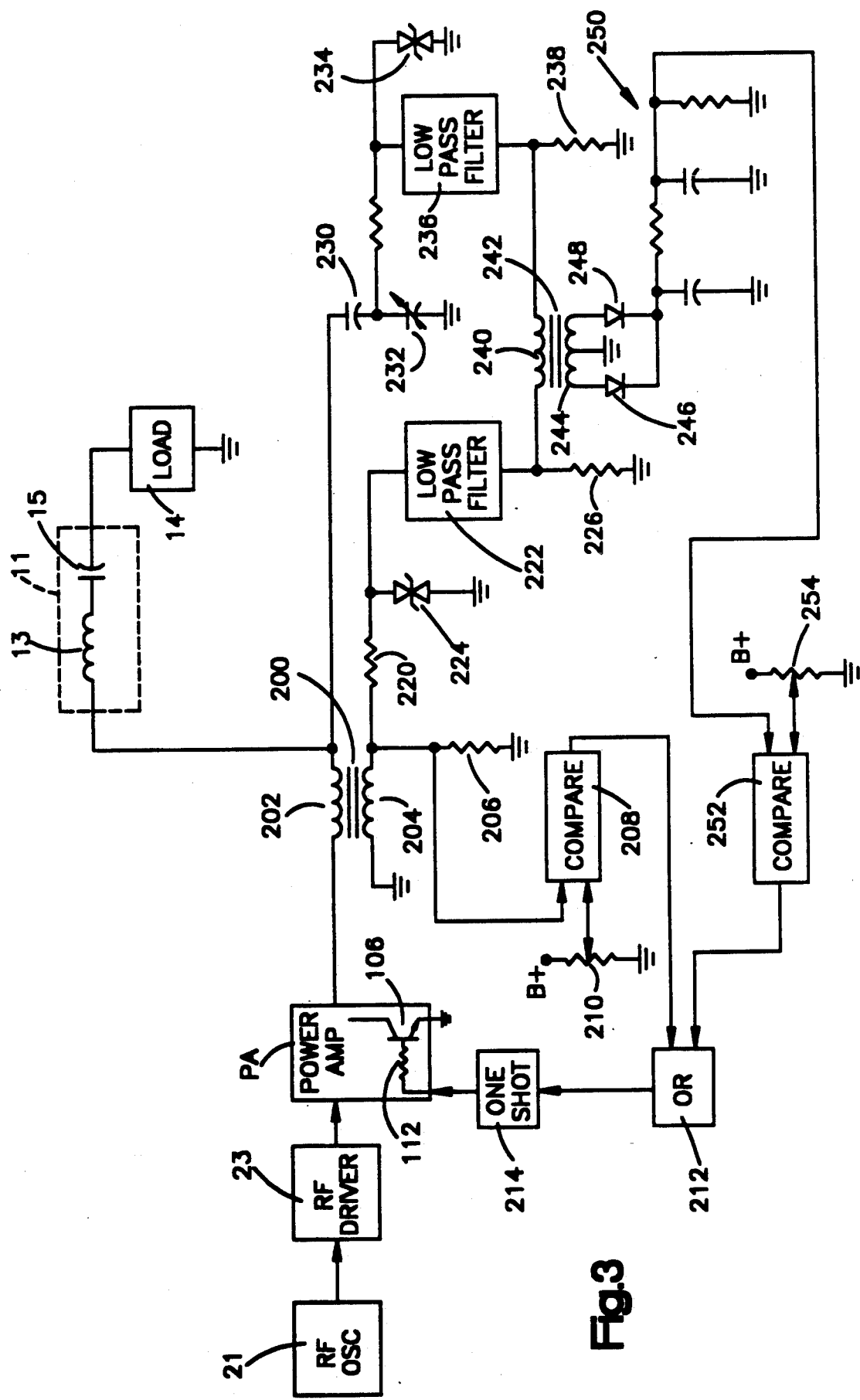
FIG. 3 is a schematic-block diagram illustration of one embodiment of the present invention.

The discussion which follows is directed to an explanation of the operation of the circuitry shown in FIG. 1 followed by a detailed description of a power amplifier as illustrated in FIGS. 2 and 2A herein as background for the discussion of the invention presented with respect to the embodiment illustrated herein in FIG. 3.

Referring now to FIG. 1, the amplitude modulator 10 is illustrated as receiving an input signal from input source 12 which may be the source of an audio signal. Modulator 10 generates an RF carrier signal which is amplitude modulated as a function of the amplitude of the input signal from source 12. The amplitude modulated carrier signal is provided on an output line connected to a load 14, which may take the form of an RF transmitting antenna. A digitizer 16 provides a plurality of digital control signals D1 through DN which have values which vary in accordance with the instantaneous level of the input signal. The control signals are binary signals each having a binary 1 or a binary 0 level. The number of signals having binary 1 or binary 0 levels is dependent upon the instantaneous level of the input signal.

Each of the output controls signals Dl-DN is supplied to one of a plurality of N RF power amplifiers $PA_1$-$PA_N$. The control signals serve to turn associated power amplifiers either on or off. Thus, if the control signal has a binary 1 level, then its associated amplifier is inactive and no signal is provided at its output. However, if the control signal is of a binary 0 level, then the power amplifier is active and an amplified carrier signal is provided at its output. Each power amplifier has an input connected to a single common RF source 20. The RF source 20 serves as the single source of an RF carrier signal which is supplied by way of an RF splitter 22 so that each amplifier $PA_1$-$PA_N$ receives a signal of like amplitude and phase and frequency. the carrier signal is amplitude modulated in accordance with the control signals D1-DN and the amplitude modulated carrier signals will be of like frequency and phase. These signals are supplied to a combiner circuit 24 comprised of a plurality of transformers $T_1, T_2, T_3, \ldots, T_N$. The secondary windings act as an independent signal source, whereby the signals provided by the various transformers additively combine with one another to produce a combined signal which is supplied to the load 14. This combined signal has the same frequency as the RF signal supplied by the RF source 20, but the amplitude of the combined signal is modulated in accordance with the input signal supplied by the input source 12.

As is conventional in such a system, the RF source 20 includes an RF oscillator 21 having a frequency on the order of 500 to 1600 KHz. This oscillator feeds an RF driver 23, the output of which is supplied to the power amplifiers $PA_1$-$PA_N$. The RF driver provides power amplification of the RF signal obtained from oscillator 21 prior to the signal being supplied to the power amplifiers at which modulation also takes place. The RF driver 23 may include several stages of amplification and may be configured similar to the power amplifiers $PA_1$-$PA_N$.

FIG. 2 illustrates one form which the power amplifier $PA_1$ of FIG. 1 may take, the other power amplifiers $PA_2$-$PA_N$ being similar. The power amplifier illustrated includes four semiconductor amplifier elements 70, 72, 74 and 76 connected in a bridge arrangement across a DC power supply voltage of, for example, 250 volts. The primary winding 44 of the associated transformer 36 is connected across the bridge junctions $J_1$ and $J_2$ of the four semiconductor elements.

More particularly, the semiconductor amplifier elements are metal oxide semiconductor, field effect transistors (MOSFETs) having three electrodes, conventionally identified as the gate, drain, and source. The drain-source paths of the transistors 70 and 72, representing their primary current paths, are connected in series across the C power supply, as are the drain-source current paths of transistors 74 and 76. The primary winding 44 of the corresponding combiner transformer T1 is connected in series with a DC blocking capacitor 78 across the common junctions $J_1$ and $J_2$ between transistors 70 and 72 and transistors 74 and 76.

The transistors 70, 72, 74 and 76 effectively operate as switches to connect the two sides of the primary winding 44 to either the DC voltage source or to ground. By proper operation of these transistors, the transformer winding 44 can be connected in either direction across the DC power supply.

This can perhaps be more readily understood by reference to FIG. 2A, which is a simplified illustration of the FIG. 2 circuitry. In FIG. 2A the transistors 70, 72, 74 and 76 are respectively characterized by conventional single pole, single throw switches $S_1$, $S_2$, $S_3$, and $S_4$. As shown in FIG. 2A, the switch $S_1$ is open and the switch $S_2$ is closed, whereby the common junction $J_1$ between them is grounded. The switch $S_3$ is closed and the switch $S_4$ open, however, whereby the junction $J_2$ between those switches is connected to the C supply voltage. Current will therefore pass through the primary winding 44 in the direction indicated by the arrow 80.

When all four switches $S_1$-$S_4$ are thrown to their opposite states, current will pass through the output winding 44 in the opposite direction. Thus, when switches $S_1$ and $D_4$ are closed and switches $S_2$ and $S_3$ opened, junction $J_1$ is connected to the DC supply and junction $J_2$ is connected to ground. In this case the current through the primary winding 44 of the transformer is in a direction opposite to that indicated by arrow 80 of FIG. 2A. An AC signal can thus be applied across the coil 44 by cyclically switching the switches $S_1$-$S_4$ between these two alternate states. If this is done at RF frequencies, then an RF carrier signal results.

Referring back to FIG. 2, the transistor switches 70, 72, 74 and 76 are controlled by signals applied to their gate electrodes. The gate signals for all four transistors are derived from individual secondary windings of a single transformer. This transformer has a toroidal ferrite core with a primary winding 82 and four secondary windings 84, 86, 88 and 90 wound around it. The turns ratio of the transformer is 1:1, whereby the same signal appearing at the primary is applied to each of the circuits connected to the four secondary windings.

Each of the four secondary windings is connected between the gate and source electrodes of an associated one of the MOSFETs 70-76. The secondary 84 is directly connected between the gate MOSFET 70 and junction $J_1$, while secondary 88 is similarly directly connected between the gate of MOSFET 74 and junction $J_2$. The secondary windings 86 and 90 are in like manner connected between the gate and source electrodes of MOSFETS 72 and 76, however in these cases impedance networks 92 and 94 are connected in series with the coils 86 and 90, respectively. Each impedance network 92, 94 includes a parallel combination of a resistor 96, 98 and capacitor 100, 102. The purpose of these impedance networks will e described hereinafter during the description of the amplifier control circuitry 104.

The primary winding 82 of the toroidal transformer is connected to the output of the RF source 20, which provides a sinusoidal RF driving voltage to the power amplifier. Each MOSFET turns "on" when the RF signal applied to its gate is on its positive half cycle and "off" when the applied signal is on its negative half cycle. The MOSFETS therefore cyclically turn on and off at a frequency and phase of the applied RF gate signal. The windings 84 and 90 are connected across MOSFETs 70 and 76 in similar directions whereby the signals appearing at the gates of these transistors are in phase with one another. MOSFETs 70 and 76 therefore turn on and off in unison. Windings 86 and 88, on the other hand, are connected across MOSFETs 72 and 74 in a direction opposite to the direction of connection of the windings 84 and 90. The signals applied to the gates of MOSFETs 70 and 76 are therefore 180° out of phase with respect to the signals applied to the gates of transistors 74 and 72. Consequently, when transistors 70 and 76 are "on", transistors 72 and 74 are "off", and vice versa.

Due to the nonlinear transfer characteristics of the MOSFETs 70, 72, 74 and 76, the MOSFETs will abruptly turn on and off in response to the applied sinusoidal signal, rather than linearly following it. The signal applied across the junctions $J_1$ and $J_2$ will therefore have essentially a squarewave form, though at the frequency of the applied RF input signal. The load 14 to which the output of the combiner circuit 24 of FIG. 1 is connected will generally be frequency selective, and will select only a fundamental component of this squarewave.

As shown in FIG. 2, the power amplifier $PA_1$ includes a switching circuit 104 for turning the power amplifier on and off in response to the control signal appearing on the digitizer output line $D_1$. The switching circuit 104 includes an NPN bipolar junction transistor 106 having its emitter grounded and its collector connected to the gates of MOSFETs 72 and 76 through corresponding diodes 108 and 110. The base of the transistor 106 is connected to the $D_1$ output of the digitizer 24 through a base resistor 112. When the control signal applied to the base resistor 112 has a high logic level (i.e., logic "1"), base current is applied to the transistor 1056, forcing it into a saturation. The gates of the transistors 72 and 76 are then effectively grounded through the corresponding diodes 108 and 110. This has the effect of clamping the gate signals of these transistors to a ground potential, thereby forcing both of them to remain in an "off" condition. The primary winding 44 is thus effectively disconnected from ground, thereby turning off the power amplifier. When the control signal $D_1$ applied to the emitter resistor 112 has a low logic level (i.e., logic "0"), however, the transistor 106 is cut off and the operation of the amplifier 26 is substantially a described previously.

The resistors 96 and 98 in the gate circuits of MOSFETs 72 and 76 limit the DC current through transistor 106 when it is saturated. Were these not included the current through the transistor 106 would be quite high because the windings 86 and 90 act as voltage sources. The capacitors 100 and 102 bypass the resistors, reducing their effect at RF frequencies. A third capacitor 114 is connected between both capacitors 100 and 102. This capacitor improves the turn-on/turn-off characteristics of the amplifier.

One of the problems associated with operating a power amplifier, such as power amplifier $PA_1$, is the fragile nature of the MOSFET transistors 70, 72, 74 and 76. More specifically, these transistors respectively include internal diodes 71, 73, 75 and 77. These diodes are sometimes referred to as body drain diodes. These body drain diodes can be overstressed by localized heating in microseconds, resulting in destruction of the transistors. Such a condition may occur during operation when a broadcast antenna is being employed during a lightning storm. In such case, a ball gap arc due to lightning may cause current to flow in the transmitter output circuit, which is illustrated in FIG. 1 as being a series circuit with an impedance matching output network 11 and a load 14. When the reflected power in the output network is detected as being sufficiently high the transmitter may be turned off. This would be done by applying a positive signal to the base of transistor 106 in each power amplifier $PA_1$-$PA_N$ described previously.

The present invention is described in conjunction with FIG. 3 and prevents transistor failure by turning the power amplifiers PA off when the phase difference between any current and any voltage in the output circuit exceeds a reference level.

The RF current flowing in the output circuit 11 is sensed with a current sensing transformer 200 having a primary winding 202 connected in series with the output circuit 11. Any RF current will be reflected in the secondary winding 204 and a voltage will be developed across a resistor 206 representative of the magnitude of the RF current. This voltage may be supplied to one input of a comparator 208 which serves to compare the magnitude of the RF current with a reference taken from a potentiometer 210. If the voltage across resistor 206 exceeds that of the reference voltage from potentiometer 210, then comparator 208 will supply a positive trigger signal through OR gate 212 to activate a one-shot circuit 214 which will apply a turn-off signal for a given period of time to turn off the power amplifier PA. As discussed hereinbefore, this is accomplished by applying a positive signal to the base of transistor 106 in each of the power amplifiers $PA_1$-$PA_N$.

The present invention will turn off the power amplifiers independently of the magnitude of the RF current flowing in the output circuit 11 whenever it is detected that the RF current is out of phase with the RF voltage by a given amount. This is achieved with the circuitry described below. The RF current sensed by the current sensing transformer 200 is supplied through a resistor 220 to a low-pass filter circuit 222 by means of a clipping diode 224. The clipping diode 224 may take the form of two zener diodes connected back-to-back in the manner as shown herein. The clipping diode serves to produce a constant amplitude squarewave signal which is then filtered by the low-pass filter 222 to provide a constant amplitude sinusoidal signal across an output resistor 226.

In addition to obtaining the current sample as described above, this circuitry also serves to obtain a voltage sample. This is accomplished by means of a voltage divider including capacitors 230 and 232 connected across the output circuit to ground. This voltage is clipped by a clipping diode 234, identical to diode 224, so as to produce a constant amplitude squarewave signal which is then supplied to a low-pass filter 236 to produce a constant amplitude sinewave signal across a load resistor 238.

The current sample as produced across resistor 226 and the voltage sample as produced across resistor 238 are supplied to opposite ends of a primary winding 240 of a transformer 242 having a secondary winding 244. The secondary winding 244 has its midpoint connected to ground and employs a pair of diodes 246 and 248 which serve as a full wave rectifier. This circuit is adjusted, as with variable capacitor 232, so that when the voltage sample and current sample are in phase, there is no output voltage from the full wave rectifier. That is, the circuit is adjusted so that the current and voltage samples exhibit the same magnitude. Any DC voltage obtained from the full wave rectifier is representative of a difference in phase between the current sample and the voltage sample. This difference is applied through an output filtering network 250 as one input to a comparator 252 having a reference taken from a potentiometer 254. When the output of the full wave rectifier exceeds that of the reference from the potentiometer 254, the comparator 252 provides an output signal through OR gate 212 to activate the one-shot circuit 212. This produces a positive output voltage for a short period of time to turn on transistor 106 in each of the power amplifiers to thereby turn off all of the power amplifiers as described hereinbefore.

Although the invention has been described in conjunction with a preferred embodiment, it is to be appreciated that various modifications may be made without departing from the spirit and scope of the invention as defined by the appended claims.

Having described the invention, the following is claimed:

1. An RF power amplifier having amplifier protection, comprising:
 an RF source for providing an RF input signal;
 an actuatable RF power amplifier having an ON condition and an OFF condition for, when ON, normally receiving and amplifying said input RF signal to provide an amplified output RF signal;

RF current sensing means coupled to said output circuit for sensing any RF current flowing in said output circuit;

RF voltage sensing means coupled to said output circuit for sensing any RF voltage at said output circuit;

means for receiving said RF current and providing therefrom a first signal of a fixed amplitude, but corresponding in frequency and phase with said RF current;

means for receiving said RF voltage and providing therefrom a second signal of said fixed amplitude, but corresponding in frequency and phase with said RF voltage;

means for receiving said first and second signals and providing therefrom a phase signal having a magnitude dependent upon the phase difference between said first and second signals; and means for comparing said phase signal with a reference and providing a turn-off signal in dependence upon said comparison for actuating said RF power amplifier to its off condition.

2. An RF power amplifier as set forth in claim 1, including means for comparing the magnitude of said RF current with a second reference level and providing a turn off signal in dependence upon said comparison.

3. Apparatus as set forth in claim 2 including turn off control means responsive to a said turn off signal for controlling actuation of said RF amplifier to its off condition.

4. An RF power amplifier as set forth in claim 1 wherein said means for providing said first signal includes first signal clipping means for limiting the magnitude of said first signal to said fixed amplitude.

5. An RF power amplifier as set forth in claim 4 wherein said means for providing said second signal includes second clipping means for limiting the magnitude of said second signal to that of said fixed amplitude.

6. An RF power amplifier as set forth in claim 5, including means for comparing the magnitude of said RF current with a second reference level and providing a turn off signal in dependence upon said comparison.

7. Apparatus as set forth in claim 6 including turn off control means responsive to a said turn off signal for controlling actuation of said RF amplifier to its off condition.

* * * * *